(12) United States Patent
Yamazaki et al.

(10) Patent No.: US 6,849,872 B1
(45) Date of Patent: Feb. 1, 2005

(54) THIN FILM TRANSISTOR

(75) Inventors: Shunpei Yamazaki, Tokyo (JP); Yasuhiko Takemura, Ohtsu (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 0 days.

(21) Appl. No.: 08/202,680

(22) Filed: Feb. 25, 1994

Related U.S. Application Data

(63) Continuation of application No. 07/929,388, filed on Aug. 14, 1992, now abandoned.

(30) Foreign Application Priority Data

Aug. 26, 1991 (JP) ............................................. 3-238709
Aug. 26, 1991 (JP) ............................................. 3-238714

(51) Int. Cl.$^7$ .......................... H01L 29/76; H01L 29/04; H01L 27/01
(52) U.S. Cl. ............................. 257/66; 257/72; 257/347
(58) Field of Search .............................. 257/57, 59, 66, 257/347, 349, 352, 353, 72

(56) References Cited

U.S. PATENT DOCUMENTS

| | | | |
|---|---|---|---|
| 4,468,855 A | * | 9/1984 | Sasaki ........................ 29/576 B |
| 4,625,224 A | * | 11/1986 | Nakagawa et al. ............ 257/66 |
| 4,656,101 A | | 4/1987 | Yamazaki |
| 4,746,628 A | * | 5/1988 | Takafuji et al. .............. 257/352 |
| 4,782,037 A | * | 11/1988 | Tomozawa et al. .......... 257/640 |
| 4,851,363 A | * | 7/1989 | Troxell et al. ............... 257/349 |
| 5,040,037 A | * | 8/1991 | Yamaguchi et al. ......... 257/347 |
| 5,041,311 A | | 8/1991 | Tsukune et al. |
| 5,112,764 A | * | 5/1992 | Mitra et al. ..................... 437/40 |
| 5,130,772 A | * | 7/1992 | Choi ........................... 257/347 |
| 5,208,476 A | | 5/1993 | Inoue |
| 5,270,567 A | * | 12/1993 | Mori et al. ..................... 257/66 |
| 5,306,651 A | | 4/1994 | Masumo et al. |
| 5,313,075 A | * | 5/1994 | Zhang et al. .................. 257/57 |

FOREIGN PATENT DOCUMENTS

| | | |
|---|---|---|
| EP | 0 387 656 | 9/1990 |
| JP | 55-050663 | 4/1980 |
| JP | 55-050664 | 4/1980 |
| JP | 56-111258 | 9/1981 |
| JP | 58-093273 | 6/1983 |
| JP | 58-164268 | 9/1983 |

(List continued on next page.)

OTHER PUBLICATIONS

Written Notice of Reasons for Revocation, mailed Apr. 20, 2004, Opposition No. 2003–71422, JP Patent No. 3352998, Japanese Patent Office.

English Translation of Written Notice of Reasons for Revocation, Opposition No. 2003–71422, mailed Apr. 20, 2004, JP Patent No. 3352998, Japanese Patent Office.

Questioning issued by the Japanese Patent Office on Sep. 7, 2004 in Appeal No. 2002–18602.

*Written Notice of Reasons for Revocation*issued by the Japanese Patent Office on Aug. 24, 2004 in Opposition No. 2003–72051, including *Reasons of Opposition*cited therein.

*Primary Examiner*—Steven Loke
(74) *Attorney, Agent, or Firm*—Eric J. Robinson; Robinson Intellectual Property Law Office, P.C.

(57) ABSTRACT

An improved type thin film semiconductor device and a method for forming the same are described. That is, in a thin film semiconductor device such as TFT formed on an insulating substrate, it is possible to prevent the intrusion of a mobile ion from a substrate or other parts, by forming the first blocking film comprising a silicon nitride, an aluminum oxide, an aluminum nitride, a tantalum oxide, and the like, under the semiconductor device through an insulating film used in a buffering, and then, by forming the second blocking film on TFT, and further, by covering TFT with the first and second blocking films.

104 Claims, 8 Drawing Sheets

FOREIGN PATENT DOCUMENTS

| | | |
|---|---|---|
| JP | 58-204570 | 11/1983 |
| JP | 59-089436 | 5/1984 |
| JP | 59-126673 | 7/1984 |
| JP | 60-170972 | 9/1985 |
| JP | 61-026264 | 2/1986 |
| JP | 63-204769 | 8/1988 |
| JP | 63-237570 | 10/1988 |
| JP | 64-023575 | 1/1989 |
| JP | 64-032678 | 2/1989 |
| JP | 64-035959 | 2/1989 |
| JP | 64-035961 | 2/1989 |
| JP | 64-047076 | 2/1989 |
| JP | 01-096960 | 4/1989 |
| JP | 01-152274 | 6/1989 |
| JP | 01-265568 | 10/1989 |
| JP | 01-276672 | 11/1989 |
| JP | 1-276672 * 11/1989 | ................. 257/347 |
| JP | 02-240267 | 9/1990 |
| JP | 3-23639 * 1/1991 | ................. 257/66 |
| JP | 03-034434 | 2/1991 |
| JP | 03-095938 | 4/1991 |
| JP | 03-095939 | 4/1991 |

* cited by examiner

Fig. 6
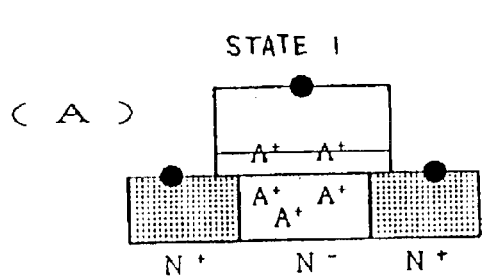
(A) STATE 1
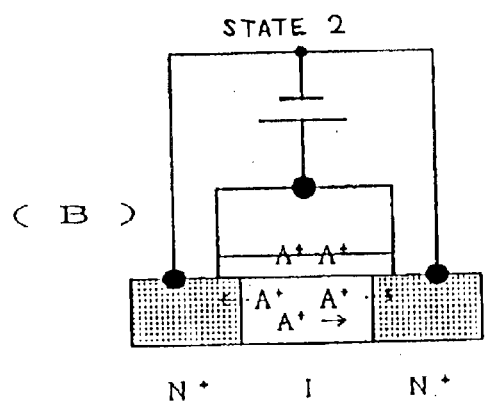
(B) STATE 2
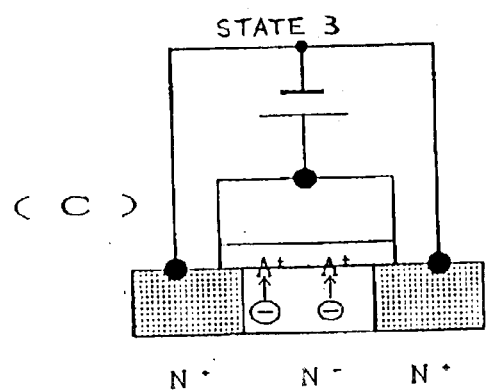
(C) STATE 3
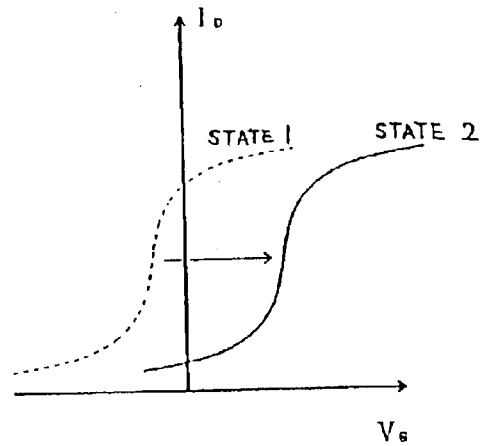
(D)
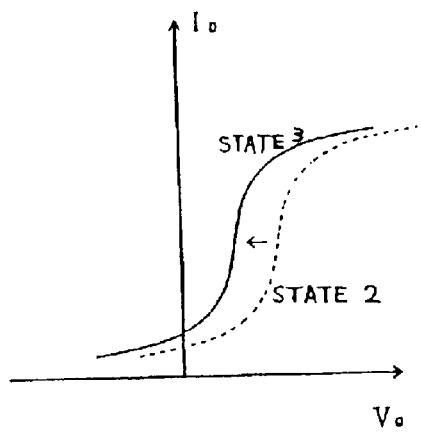
(E)

Fig. 7
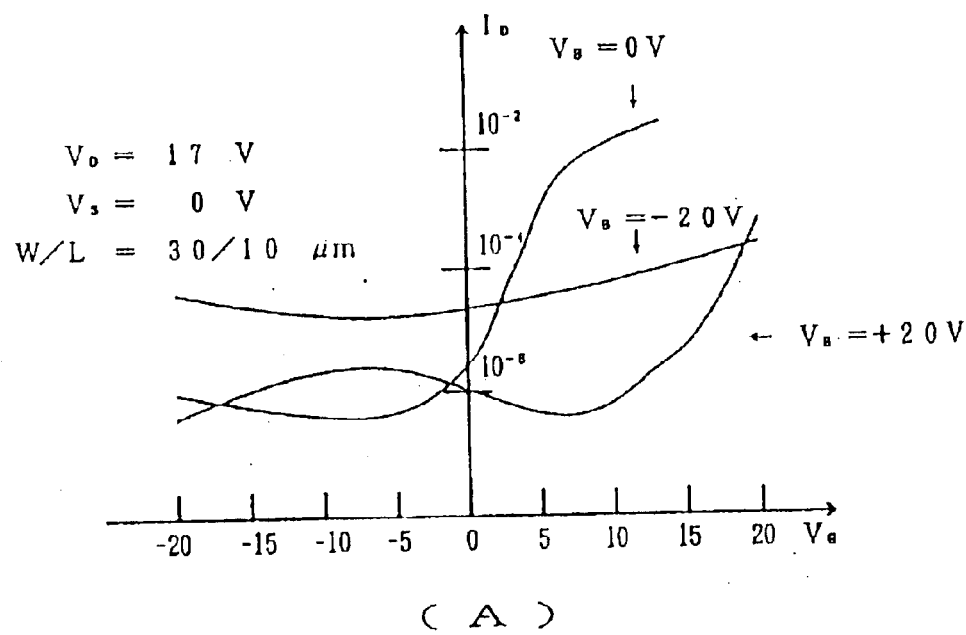
(A)
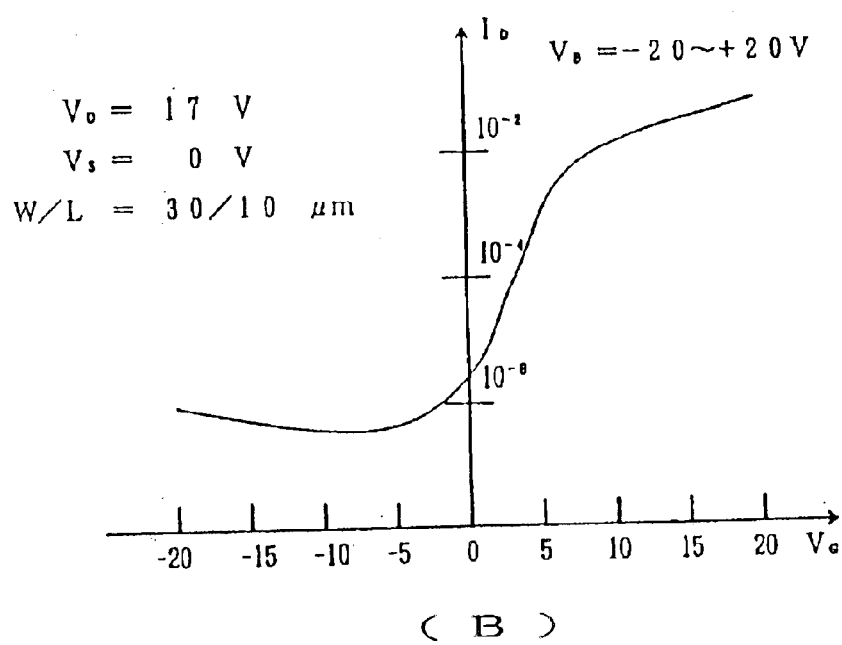
(B)

Fig. 8
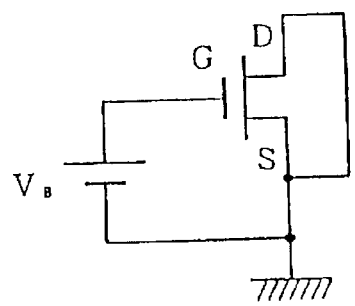
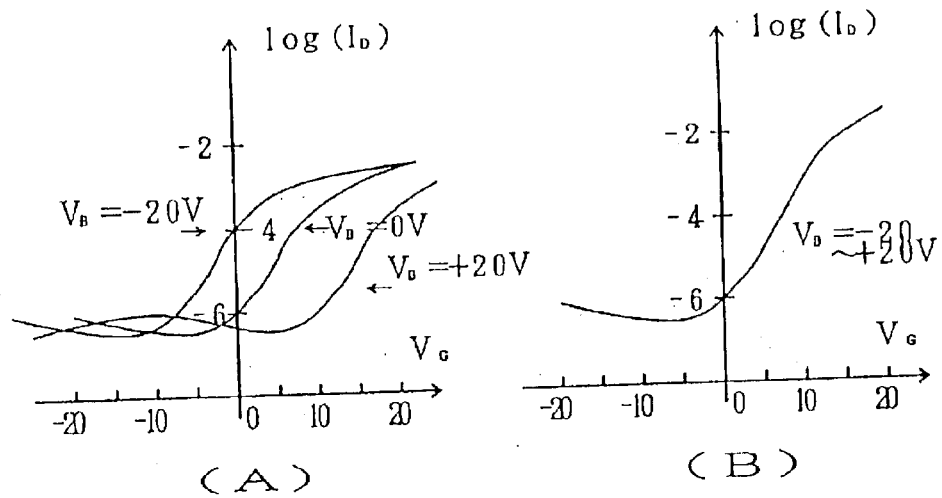
(A)    (B)
$V_D = 17$ V
$V_s = 0$ V
$W/L = 30/10$ μm

THIN FILM TRANSISTOR

This application is a Continuation of application Ser. No. 07/929,388, filed Aug. 14, 1992, now abandoned.

BACKGROUND OF THE INVENTION

1. Field of the Invention

The present invention relates to a thin film semiconductor device and a method for forming the same. More particularly, the present invention relates to a thin film semiconductor device and a method for forming the same which excel in confidence, productivity, and yield thereof. The present invention is applicable to e.g. a three dimensional integrated circuit or a driving circuit used in a liquid crystal display or a thin film image sensor and the like.

2. Description of the Related Art

Heretofore, a semiconductor integrated circuit has been mainly a monolithic type, which has been formed on such semiconductor substrate as silicon. Recently, it has been tried to form it on an insulating substrate made of glass, sapphire, and the like. This is caused by the reasons that an operation speed will be raised according to the lowering of parasitic capacity between a substrate and a wiring, especially quartz or glass materials are not limited in size like a silicon wafer, cheap, easy to separate each device, and further a latch-up phenomenon, which poses a problem in a monolithic circuit of CMOS, will not arise. Also, it is necessary to form a thin film transistor (hereinafter refer to as TFT) etc. on a transparent substrate, because a semiconductor device and a liquid crystal element, or a light detecting element are required to be composed in a body, in a liquid crystal display and a contact type image sensor.

According to these reasons, a thin film semiconductor device has come to be formed on an insulating substrate. As shown in FIG. 5 which represents an instance of the usual thin film semiconductor device, a film 503 of silicon oxide etc. is formed on an insulating substrate 501, as a passivation film, and thereon, TFT is formed independent of other TFT. TFT has a source (drain) region 507, a drain (source) region 509, a channel forming region 508 (simply called as a channel region) which is held between the said regions of 507 and 509, a gate insulating film 504, a gate electrode 510, a source (drain) electrode 511, and a drain (source) electrode 512, just like MOSFET of a monolithic integrated circuit. Also, there is provided with an interlayer insulation 506 of PSG (phosphosilicate glass) so that a multilayer interconnect can be made.

The instance of FIG. 5 is called as a coplanar type, but, TFT has further different types such as an inverse coplanar type, a stagger type, and an inverse stagger type, according to the arrangement of a gate electrode and a channel region. These types are well known in the usual literatures to which the details can be referred.

Also in case of the monolithic integrated circuit, such alkaline ion as sodium and potassium, or such transition metal ion as iron, copper, and nickel poses a serious contamination problem, and much attention has been paid to stop the intrusion of these ions. In case of TFT, the problem of these ions are important alike, and close attention has been so given to the purification in a manufacturing process as to avoid the ion contamination to the utmost. And also a countermeasure has been taken so that the contamination of these ions do not extend to the device.

A thin film semiconductor device is different from a monolithic integrated circuit, in a point that a contaminated ion concentration in a substrate of the former is rather higher than that of the latter. That is, a single silicon crystal used in a monolithic integrated circuit has been so manufactured as to eliminate these harmful elements, based on the long experienced technologies. The content of these elements contaminated in the present products on sale is $10^{10}$ cm$^{-3}$ or less.

However, in general, the concentration of elements contaminated in an insulating substrate usable for a thin film semiconductor device is not low. Of course, it is theoretically possible to reduce a strange element concentration, which will be the above contamination source, in case of such single crystal substrate as a spinel or a sapphire substrate. But it is not actual from a profitable point of view.

Also, in case of a quartz substrate, it is ideally possible to suppress the intrusion of the strange element, if it is prepared in a gaseous reaction (vapor reaction), using a high purity of silane gas and oxygen as a raw material. But it is difficult to send out the strange element to the outside in case it is once taken in, as the structure of quartz substrate is amorphous. A substrate used in a liquid crystal display gives a priority to the cost problem in particular, and then it is needed to use a cheap one, which originally contains various sorts of strange elements so as to make the manufacturing and the processing easy. There are strange elements which are not desirable in themselves for a semiconductor device, and there are cases where the strange elements will be mixed from the outside in the process of their adding, or these are contained in an adding material as an impurity.

Since for example, AN glass manufactured by Asahi Glass Corporation having as a main component barium borosilicate glass is a cheap glass substrate, heat resisting, and equivalent to silicon in a heat expansion coefficient, it is desirable for a substrate used in a liquid crystal display. But it contains about 5% of lithium, a portion of which is ionized to intrude into a semiconductor device as a mobile ion, and to deteriorate a device grade. Also it is difficult to prepare a high purity lithium of 99% or more, and about 0.7% of sodium is usually contained therein. An ionization ratio of sodium is very high to show about 10%, which brings about a very serious effect on the device features.

As shown in FIG. 5, in the conventional thin film semiconductor device, silicon oxide etc. has been used as a passivation film to cope with the intrusion of these mobile ions. Also these ions have been dealt with by gettering them, employing PSG (Phosphosilicate glass) or BPSG (Borophosphosilicate glass) as a interlayer insulation. However, it has been difficult to prevent the contamination effectively by these methods.

SUMMARY OF THE INVENTION

Accordingly, it is an object of the present invention to effectively suppress the deterioration of a device which is caused by the intrusion of these contaminated elements or ions. In accordance with the present invention, it is characterized in that so as to control the above contamination, a blocking film such as a film of silicon nitride, aluminum nitride, aluminum oxide, tantalum oxide and the like, which has a function to block the mobile ion, is formed on and beneath a thin film semiconductor device, and further, $1\times10^{18}$ to $5\times10^{20}$ atoms/cm$^3$, preferably $1\times10^{19}$ to $1\times10^{20}$ atoms/cm$^3$ of such halogen element as chlorine and fluorine is contained in either one or two of the semiconductor film (channel region provided in the semiconductor film) and the gate insulating film which constitute TFT. The halogen element has a function that it will combine with such mobile ion as sodium strongly, in the semiconductor film or the insulating film, and then will lower the ion effect exceedingly.

A typical instance according to the present invention is shown in FIG. 1, in which TFT applied by the present invention is illustrated. That is, the first silicon nitride film 102 is formed on an insulating substrate 101, as the first blocking film which functions to keep away the contamination through a substrate. On the first silicon nitride film, e.g. such silicon oxide film (insulating film) 103 as has a good contacting property with a silicon material is formed. If TFT is prepared by a direct forming of a semiconductor film, on the first silicon nitride, without forming the film 103, TFT will not operate, as a channel region will act as a conductor, according to a trap level generated in a boundary surface between the silicon nitride and the semiconductor material. It is therefore important to provide such a buffer material.

TFT is formed on the film 103. TFT has a source (drain) region 107, a drain (source) region 109, a channel region 108 provided between the regions of 107 and 109, a gate insulating film 104, and a gate electrode 110. Each region of source, drain, and channel of TFT is formed, employing a semiconductor material which is a single crystal, a polycrystal, or an amorphous. As the semiconductor material, for example, silicon, germanium, silicon carbide, and alloys thereof can be used.

Then, as the second blocking film, the second silicon nitride film 105 is formed covering this TFT. The present invention has the features that the second silicon nitride film is formed, after the formation of TFT and also before the formation of an electrode at the source and/or the drain. In the prior arts, a silicon nitride film as a final passivation film is formed, after a formation of an electrode. The silicon nitride film of the present invention, however, is different from that formed by the prior arts under such meaning. That is, the second silicon nitride film of the present invention is formed, in order to envelop TFT along with the first silicon nitride film. The present invention also aims at the prevention of contamination in an electrode formation process, after the forming of TFT. Therefore, it may be possible to form the silicon nitride film as a final passivation film, like the prior arts, after TFT and its accompanied electrode or wirings are formed in accordance with the present invention.

Then, after the formation of the second silicon nitride film, an interlayer insulating film 106 is formed, with an interlayer insulating material e.g. PSG (phosphosilicate glass) and so on. After that, a source (drain) electrode 111 and a drain (source) electrode 112 are formed. As aforementioned, it may be possible that an aluminum oxide, an aluminum nitride or a tantalum oxide instead of a silicon nitride is used as a blocking film.

In the instance of FIG. 1, however, a gate insulating film extends in a distance, and there is a possibility that a mobile ion etc. will intrude into the innerside of TFT from an edge part of the said gate insulating film extension. The improvement on this point is shown in FIG. 2, in which a gate insulating film is situated only on TFT. Then, this type has no problem posed in FIG. 1, but it is possible to disturb an operation of TFT in this case, on account of the reason that a silicon nitride part, which is in contact with a source region and a drain region parts being adjacent to a channel region, is polarized or traps electron by a gate voltage.

An instance which overcomes the above problem is shown in FIG. 3, in which a source region and a drain region being adjacent to a channel region are not neighboring to and not in contact with a silicon nitride film. So that the above problem of the polarization and the electron-trap of a silicon nitride can be solved. However, in case of applying a self-alignment process using a gate electrode as a mask, in the forming of a source and a drain region, it is necessary to implant an acceptor or a donor element through a gate insulating film, similarly in an instance of FIG. 1. For that purpose, if an ion implantation method is employed, it is required to raise an ion acceleration energy. On that occasion, a high speed ion will be implanted thereinto, and then, it is possible that a source and a drain region are expanded by a secondary scattering of the high speed ion.

In FIG. 2, the numerals are as follows:

201; an insulating substrate, 202; the first silicon nitride film, 203; an insulating film used in buffering for silicon nitride etc. 204; a gate insulating film, 205; the second silicon nitride film, 206; an interlayer insulating film, 207; a source (drain) region, 208; a channel region, 209; a drain (source) region, 210; a gate electrode, 211; a source (drain) electrode, and 212; a drain (source) electrode.

In FIG. 3, the numerals are as follows:

301; an insulating substrate, 302; the first silicon nitride film, 303; an insulating film used in buffering for silicon nitride etc., 304; a gate insulating film, 305; the second silicon nitride film, 306; an interlayer insulating film, 307; a source (drain) region, 308; a channel region, 309; a drain (source) region, 310; a gate electrode, 311; a source (drain) electrode, and 312; a drain (source) electrode.

In case where a silicon nitride film is used as a blocking film, according to the present invention, a good result has been obtained by selecting the followings.

In the formula represented by $SiN_x$, x=1.0 to 1.7, preferably x=1.3 to 1.35. (stoichiometric composition, x=1.33). Therefore, in the present invention, it is better to form a silicon nitride by using a low pressure CVD method. But it is needless to say that even the silicon nitride film formed by a plasma CVD method or a light CVD method has more confidence in a device quality, compared with the one formed without using the present invention.

In case where a silicon nitride film is formed by a low pressure CVD method, as a raw material, dichlorosilane ($SiCl_2H_2$) and ammonia ($NH_3$) are used. As a reaction condition, pressure: 10 1000 Pa and temperature: 500 to 800° C., preferably 550 to 750° C., are employed. Of course, silane ($SiH_4$) and tetrachlorosilane ($SiCl_4$) can be used.

In case where an aluminum oxide film or a tantalum oxide film is used in the present invention, the closer to $Al_2O_3$ or $Ta_2O_5$ a stoichiometric composition was, the better result could be obtained. These films are formed by a CVD method or a sputtering method. For example, an aluminum oxide film can be formed by oxidation of trimethyl aluminum $Al(CH_3)_3$ with nitrogen oxides ($N_2O$, NO, $NO_2$).

In order to carry out the present invention more effectively, it is recommended that the hydrogen atom concentration in a semiconductor film of such thin film semiconductor device as TFT be four times or less, preferably one time or less of the added halogen atom, and that the concentration of a harmful element such as carbon, nitrogen, or oxygen be $7\times10^{19}$ cm$^{-3}$ or less, preferably $1\times10^{19}$ cm$^{-3}$ or less. Further, it is recommended that the concentration of a mobile ion such as sodium, lithium, or potassium contained in a semiconductor film be $5\times10^{18}$ cm$^{-3}$ or less.

In order to achieve the above mentioned objects, it is desired to use a gas having a high purity of 99.999% or more, paying a full attention to a material gas. Further, according to the present invention, the insulating substrate containing a lot of mobile ion sources is born in mind to be used. Then, in order to conduct the present invention more efficiently, it is preferable to cover without omission all the circumference of insulating substrate, when the first silicon nitride film is formed on such substrate. In such situation, it is possible to exceedingly lower a probability that a mobile ion mixes into an device region from the substrate.

FIG. 4 shows an instance of forming a lightly doped drain (LDD), which is a well known prior art, according to the present invention. First of all, a silicon nitride film 402 is formed on such insulating substrate 401 as quartz or AN glass in 50 to 1000 nm, using a low pressure CVD method. At this time, by covering all the surface of substrate including its back side too, as aforesaid, the probability that a mobile ion generated in the back side reaches to the surface at a later process, for example, the probability that a mobile ion intrudes into a film during a gate oxide film forming, will be remarkably lowered. Also, it is preferable in keeping the manufacturing equipments purified. A silicon oxide film 403 used in buffering is formed on a silicon nitride film in 50 to 1000 nm thick, also using a low pressure CVD method. At this time, a halogen element such as chlorine, fluorine will be involved in the obtained silicon oxide film, if a gas containing such halogen as hydrogen chloride (HCl), nitrogen fluoride ($NF_3$ or $N_2F_4$), chlorine ($Cl_2$), fluorine ($F_2$), all sorts of fleon gas, and carbon tetrachloride ($CCl_4$) is mixed in a raw material gas, in a ratio of 3% to 6% by volume, e.g. 5% by volume.

This halogen combines with such alkaline ion as sodium, to fix sodium, then it is very effective to prevent sodium contamination. But it is not preferable that an excess addition of a halogen makes a film rough and damages its adhesion property and surface flatness. Also, it is recommendable to mix the above gas containing a halogen element in a raw material gas in a ratio of 2 to 5% by volume, in case of forming the said film using a light CVD method or a plasma CVD method, instead of a low pressure CVD method. Further, it is recommendable to mix the above halogen gas in a sputtering atmosphere by 2 to 20% by volume, in case of forming the said film by a sputtering method. Since the composition in an atmosphere does not be reflected to a film composition, it is needed to increase a little more concentration of halogen gas than the case of CVD methods.

Then, an amorphous silicon film, a microcrystal or a polycrystal silicon film is formed in contact with the silicon oxide film 403, in 20 to 500 nm thick, by means of a low pressure CVD method, a plasma CVD method, or a sputtering method. Then, this is etched to form the island shape. When the silicon film is formed, it is preferable to introduce a halogen element into the film, in the same way as the forming of the aforesaid film 403. As a method to introduce a halogen element, it may be possible to mix a gas containing a halogen into a film forming atmosphere, in the same method as the aforementioned film 403, or to introduce the gas after the film forming, by an ion implantation method. At this time, it is required to control a raw material gas concentration so that a halogen element concentration in a film be in the range of $1\times10^{18}$ to $5\times10^{20}$ atoms/$cm^3$, preferably $1\times10^{19}$ to $1\times10^{20}$ atoms/$cm^3$.

Still further, at the same time, if a hydrogen element concentration in a film is four times as much as or less, preferably one time as much as or less than that of a halogen, a halogen adding effect will be raised. This effect can be explained as follows: Hydrogen is necessary to terminate a dangling bond of silicon, but its combination is weak and is simply loosed. On the other hand, halogen element combines with silicon strongly. If hydrogen exists in a silicon excessively, which is meant by that there are a lot of dangling bonds in a film, almost all the halogen will combine with silicon. Then, it is impossible to effect gettering of a mobile ion traveling in a film. Therefore, it can be supposed that in a silicon containing much hydrogen, the halogen adding effect will be lowered. To the contrary, in a silicon containing less hydrogen, the halogen adding effect will be raised vice versa.

Also, it is desired that as a harmful element except a mobile ion, the concentration of carbon, nitrogen, and oxygen be $7\times10^{19}$ atoms/$cm^3$ or less, preferably $1\times10^{19}$ atoms/$cm^3$ or less, in such semiconductor film as silicon. This is resulted from the reason that these elements can not be removed by adding halogen.

Further, though the gettering of such mobile ion as sodium lithium, and, potassium can be effected by adding halogen, this effect will be denied in case where these elements exist in excess. Therefore, it is preferable that the concentration of each mobile ion be $5\times10^{18}$ atoms/$cm^3$ or less.

Then, on a silicon film formed as above mentioned, a silicon oxide film as a gate insulating film is formed, in 10 to 200 nm, preferably 10 to 100 nm, using a low pressure CVD method or a sputtering method. In this case, it is also preferable to mix a halogen containing gas beforehand in a raw material gas or a sputtering gas, in the same way as mentioned before.

Next, on this silicon oxide film, a polycrystal or a microcrystal silicon film, in which about $10^{21}$ $cm^{-3}$ of phosphorus is doped, is formed using a low pressure CVD method or a plasma CVD method. Then, the silicon film and the gate insulating film (silicon oxide) provided beneath the silicon film are patterned to form a gate electrode 410 and a gate insulating film 404.

Further, a source (drain) region 407 and a drain (source) region 409, which contain comparatively low impurity concentration (about $10^{17}$ to $10^{19}$ $cm^{-3}$), are formed, implanting an ion in a self-alignment method, using this gate electrode as a mask. The portion where an impurity is not implanted remains as a channel region 408. Thus, FIG. 4(A) is obtained.

Next, as shown in FIG. 4(B), a PSG (phosphosilicate glass) film 413 is formed throughout the surface, using a low pressure CVD method. And this is etched by the conventional direction depending etching method to form a side wall 414, in the side of a gate electrode. Then, a source (drain) region 407a and a drain (source) region 409a, which contain a high impurity concentration, are formed by implanting an ion again. A region having a low impurity concentration becomes a source (drain) region 407b and a drain (source) region 409b, and forms LDD (lightly doped drain). Thus, FIG. 4(C) is obtained.

After that, as shown in FIG. 4(D), a silicon nitride film 405 is formed all over the surface, in 50 to 1000 nm thick using a low pressure CVD method. Then, a silicon film is crystallized to activate a source, drain region, by a low temperature annealing of e.g. 600° C. This process can be effected by a laser annealing. Thus, TFT intermediate is obtained.

FIG. 4 shows one preferred example of the present invention, and the present invention is not limited to the above process. In the example of FIG. 4, a silicon nitride film, a gate electrode, and a source or a drain region do not adjoin, like the example of FIG. 3. That is, the case of FIG. 4 is different from that of FIG. 2 in that a side wall 414 is provided. Then, there is no problem which was worried about in FIG. 2. Further, the case of FIG. 4 is characterized in that an adding of a donor or an acceptor can be easily effected without passing an insulating film, in different way from the case of FIG. 3.

BRIEF DESCRIPTION OF THE DRAWINGS

The objects, features, and advantages of the present invention will be become more apparent, from the following description of the preferred embodiments taken in conjunction with the accompanying drawings, in which:

FIG. 6 shows a mobile ion effect on the characteristics of TFT.

FIG. 7 shows TFT characteristics, in cases of using the present invention and without using the present invention.

FIG. 8 shows another TFT characteristics, in cases of using the present invention and without using the present invention.

DETAILED DESCRIPTION OF THE PREFERRED EMBODIMENT

Figure 1:
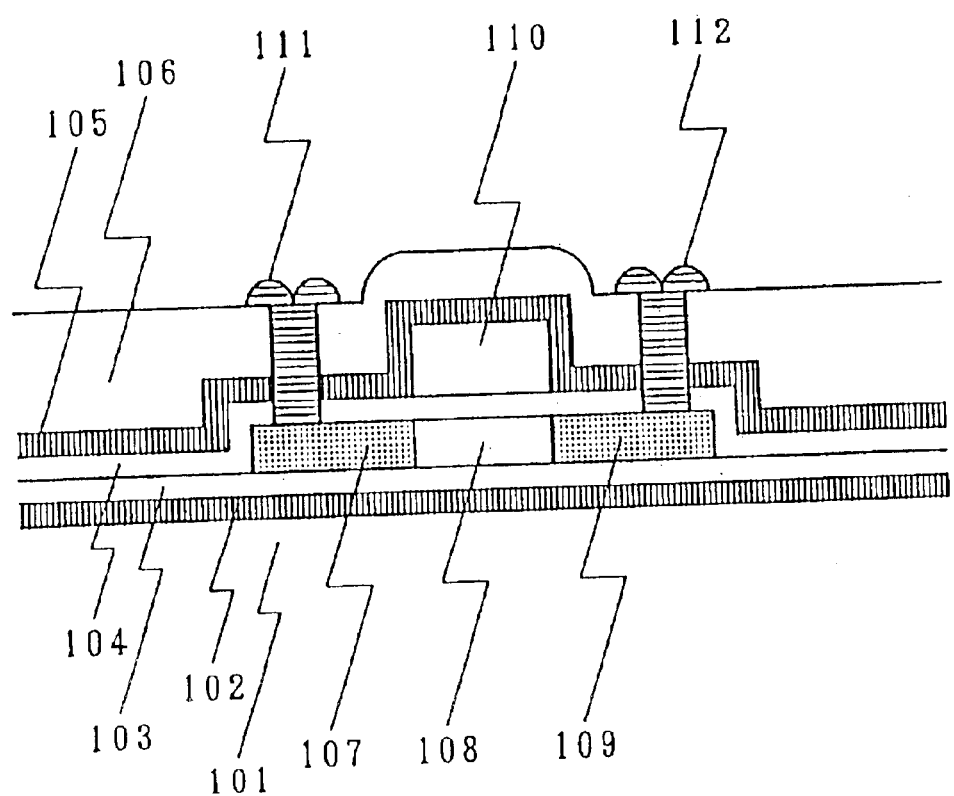
FIG. 1 shows an example of TFT in accordance with the present invention.
Figure 2:
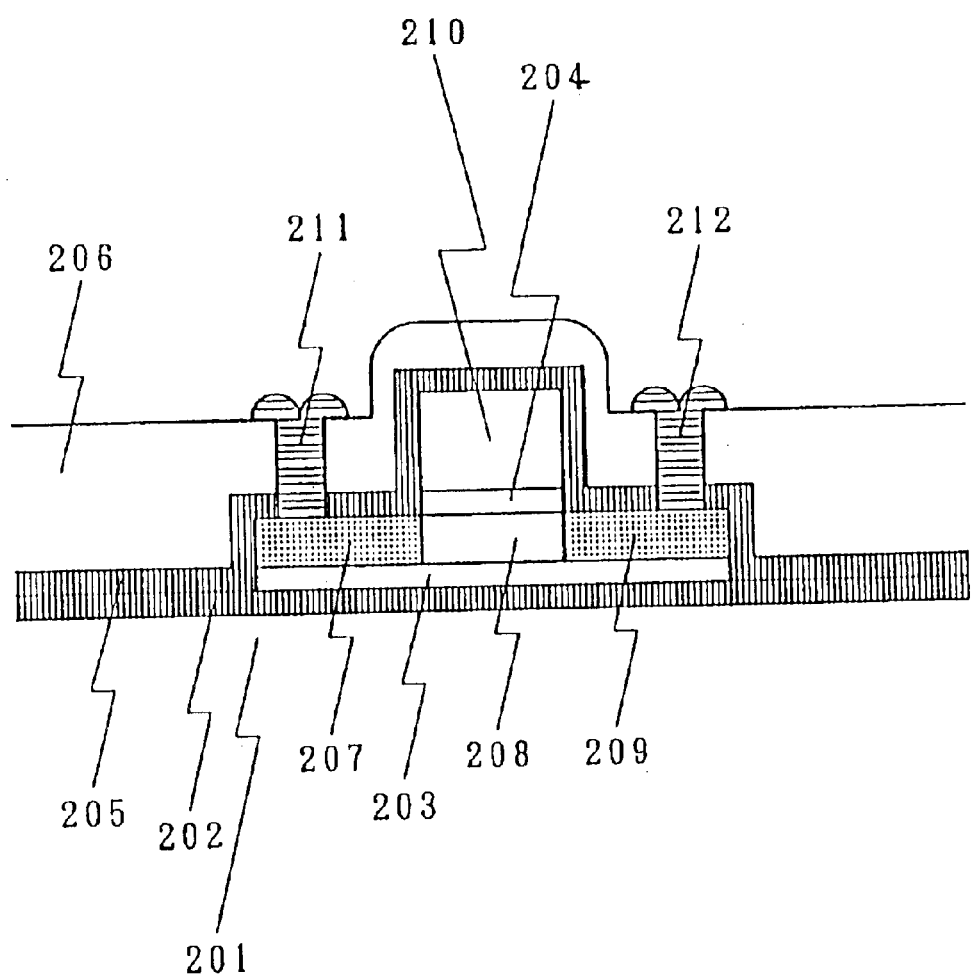
FIG. 2 shows an another example of TFT in accordance with the present invention.
Figure 3:
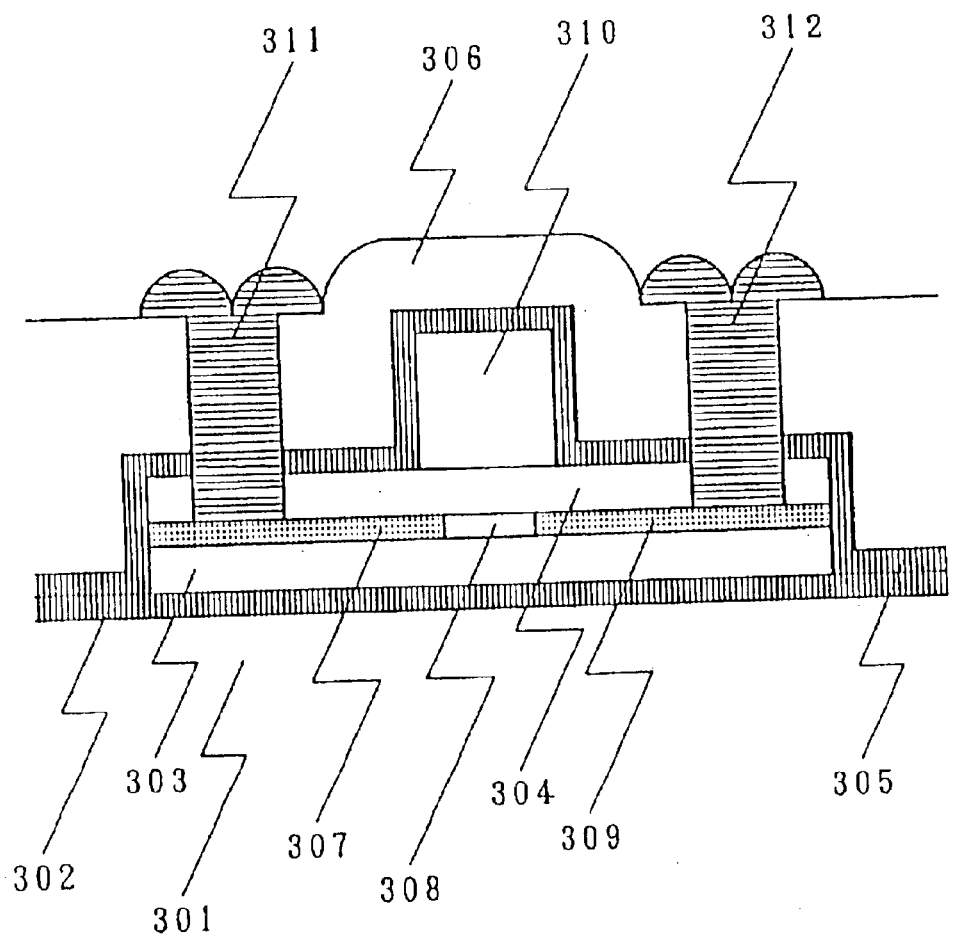
FIG. 3 shows a still another example of TFT in accordance with the present invention.

The present invention will be explained in more detail by reference to the following Examples, in connection with the drawings. The present invention is by no means limited to the Examples.

EXAMPLE 1

The characteristics of TFT in accordance with the present invention is described as follows. TFT used in this Example was a LDD type TFT prepared on a quartz glass, according to the process of FIG. 4. First of all, a silicon nitride film 402 was formed in 100 nm thick, on a quartz glass 401 and also a back and a side thereof (i.e. in whole surface of the substrate), using a low pressure CVD method. Then, continuously by this low pressure CVD method, a silicon oxide film (insulating film) 403 (a low temperature oxidation film, LTO film) was formed in 200 nm thick. Lastly, by this low pressure CVD method as well, an amorphous silicon film was formed on the silicon oxide film 403 in 30 nm thick. At this time, the maximum process temperature was 600° C.

Next, the amorphous silicon was patterned into the island shape. Then, the very thin surface portion of the amorphous silicon was oxidized, in 2 to 10 nm thick by an anodic oxidation method. The oxidized surface portion comprised silicon oxide. Then, a silicon oxide film (insulating film) was formed thereon in 100 nm by a sputtering method. Here, the sputtering atmosphere was mixed gases consisting of oxygen and argon, or other rare gas, and the oxygen partial pressure thereof was 80% or more. At this time, a defect generated in a surface film by a shock of sputtering. For example, if the surface film is a silicon film, oxygen atom is implanted in the silicon to increase an oxygen concentration. Under this status, silicon will be in a high localized level. Namely, a boundary between silicon and silicon oxide will be unclear. However, according to the present Example, the beforehand forming of the thin anodic oxidized film can prevent the above atom mixing, and then the boundary between silicon and silicon oxide can be kept clear. This is due to the reason that there exists silicon oxide in advance in sputtering.

After forming of this silicon oxide film, an n$^+$-type microcrystal silicon film containing $10^{21}$ cm$^{-3}$ degree of phosphorus was formed in 300 nm thick, using a low pressure CVD method. The maximum process temperature during the above film forming was 650° C. Then, patterning was carried out to form a gate electrode 410 and a gate insulating film 404. The gate electrode 410 was made from the n$^+$-type microcrystal silicon film and the gate insulating film 404 was made from the anodic oxidized surface portion and the silicon oxide film formed thereon. Further, a source and drain regions 407 and 409 were formed, by implanting $2 \times 10^{18}$ cm$^{-3}$ of arsenic ion using an ion implantation. Thus, FIG. 4(A) was obtained.

As shown in FIG. 4(B), PSG (phosphosilicate glass) film 413 was formed by a low pressure CVD method, and as shown in FIG. 4(C), a side wall 414 was formed by a direction depending etching method. Then, $5 \times 10^{20}$ cm$^{-3}$ of an arsenic ion was implanted in the regions 407a and 409a, by an ion implantation.

After that, a silicon nitride film 405 was formed all over the surfaces by a low pressure CVD method. Thereby, FIG. 4(D) was obtained. Then, it was annealed at 620° C. for 48 hrs. in a vacuum to activate the regions 407a, 407b, 408, 409a, and 409b. Then, as an interlayer insulation, PSG (phosphosilicate glass) film was formed all over the surface by a low pressure CVD method. And a hole was made to provide an aluminum electrodes in the source and the drain regions. Lastly, for the purpose of a passivation, a silicon nitride film was again formed all over the surface, using a low pressure CVD method.

TFT prepared in this way as mentioned above was remarkably high in confidence. It showed that the operation features of an device did not change by even a so-called Bias-Temperature treatment. (BT treatment). The features are illustrated in FIG. 8. BT treatment was conducted by applying a bias voltage $V_B$ between the gate (G), the source(S), and the drain(D) of a circuit shown in FIG. 8 under heating. Concretely, as soon as TFT was prepared, the gate voltage-drain current characteristic of the TFT was measured at room temperature ($V_B$=0). Then, +20 V of voltage was applied to the gate electrode at 150° C. for an hour and the measurement of the gate voltage-drain current characteristic of the TFT at room temperature was conducted ($V_B$=+20 V). Next, -20 V of voltage was applied to a gate electrode again at 150° C. for an hour, then the gate voltage-drain current characteristic of the TFT was measured at room temperature ($V_B$=-20 V), and the fluctuations of threshold value voltage of TFT was examined. FIG. 8(B) shows a TFT features obtained by the method described in the above. Like this, the features were not dependent on the bias voltage $V_B$, on TFT according to the present Example, and the fluctuations of threshold value voltage was 0.2 V or less by the accurate measurement.

On the other hand, FIG. 8(A) shows TFT obtained by the same process with the present Example, excepting that the silicon nitride films 402 and 405 were not provided. As evident in FIG. 8(A), TFT features are very dependent on the $V_B$. Such fluctuations (fluctuations of threshold value) are explained to be caused by such mobile ion as sodium etc. in a gate insulating film. Namely, it is explained that the more mobile ion is contained, the more fluctuations are effected, and that the case where the fluctuations are few as shown in FIG. 8(B) are due to a small amount of the mobile ion. It is estimated that a mobile ion in a gate electrode of TFT prepared by the present Examples is about $8 \times 10^{10}$ cm$^{-3}$, from the fluctuations width of threshold value voltage. Thus, it is possible to improve the features of TFT remarkably and to raise its confidence by providing a silicon nitride film in accordance with the present invention.

EXAMPLE 2

Figure 4:
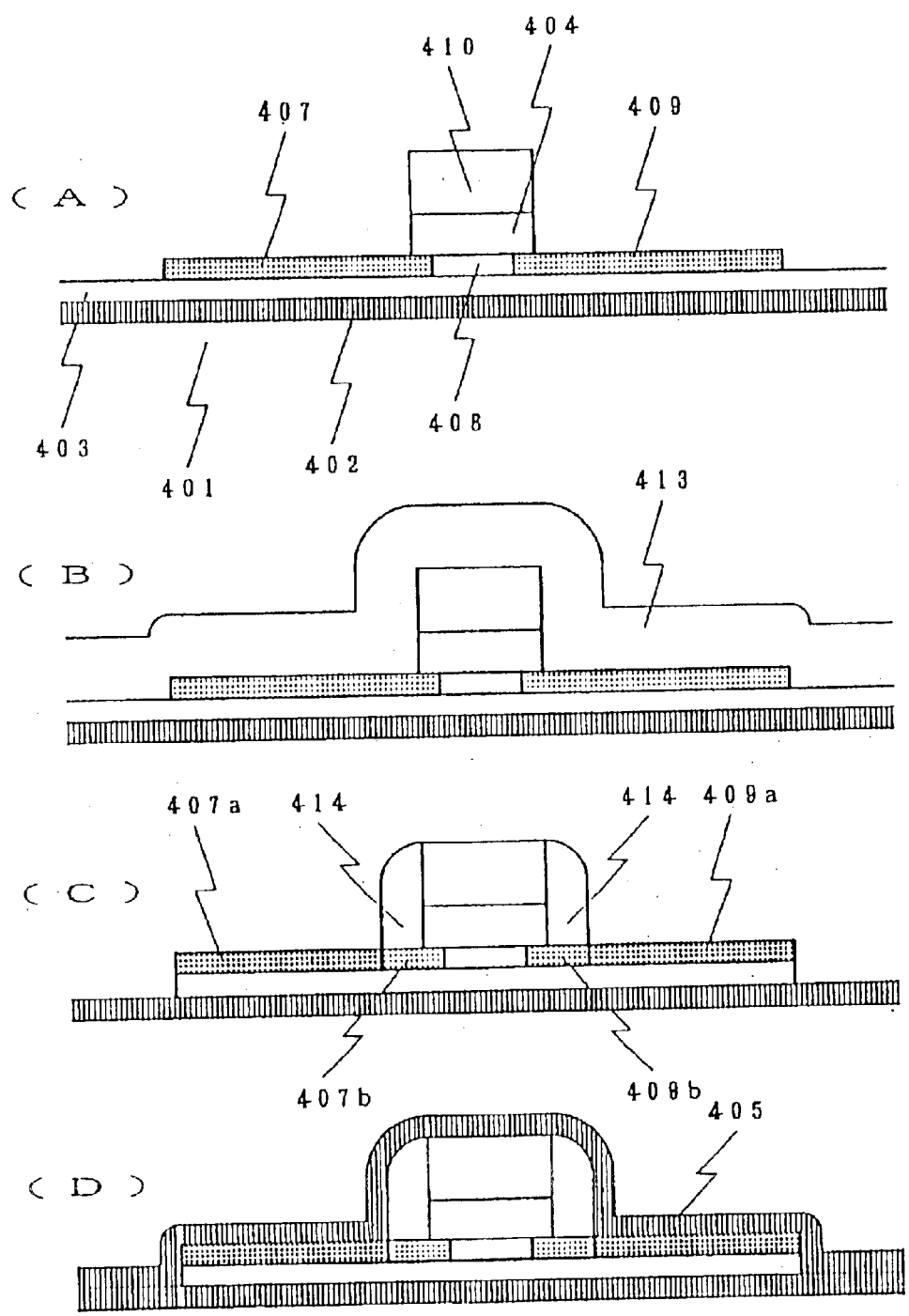
FIG. 4 shows a preparing example of TFT in accordance with the present invention.
Figure 5:
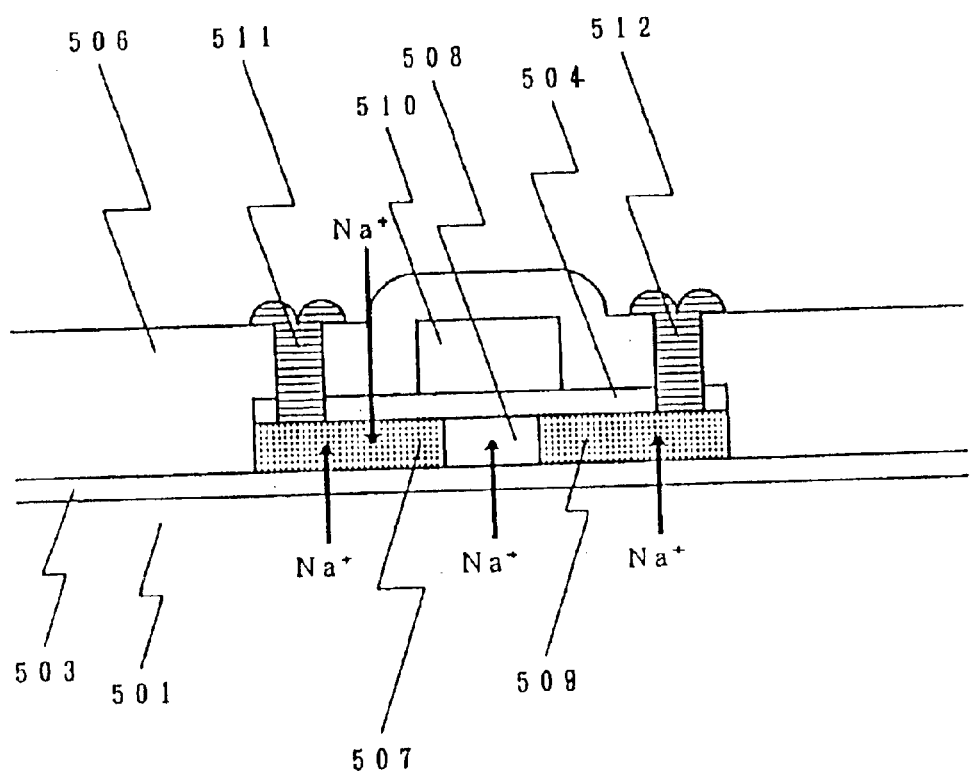
FIG. 5 shows an example of the conventional TFT.

TFT used in this Example was a LDD (lightly doped drain) type TFT, which was prepared on a quartz glass substrate according to the process of FIG. 4. Firstly, a silicon nitride film 402 was formed on a quartz glass substrate 401 and a back thereof, in 100 nm thick by a low pressure CVD method. Then, a silicon oxide film (low temperature oxidation film, LTO film) 403 was formed continuously in 200 nm thick by a low pressure CVD method. Lastly, an amorphous silicon film was formed thereon, in 30 nm thick by also a low pressure CVD method. At this time, the maximum temperature of the process was 600° C. In this process, the film forming was carried out in a CVD apparatus consisting of three reactors arranged in succession, but in case of the forming of a silicon oxide film and an amorphous silicon film, a reaction was effected by adding 5% by volume of hydrogen chloride gas (HCl) as a halogen additive gas, in addition to a raw material gas.

As a result, a halogen (chlorine) could be added in a silicon oxide film and an amorphous silicon film. By a secondary ion mass spectrometry, the chlorine contents in a silicon oxide film and an amorphous silicon were $2.3 \times 10^{19}$ atoms/cm$^3$, $3.1 \times 10^{19}$ atoms/cm$^3$, respectively. As a raw material gas of a silicon nitride film, dichlorosilane (SiCl$_2$H$_2$) and ammonia (NH$_3$), as a raw material gas of a silicon oxide film, disilane (Si$_2$H$_6$) and oxygen (O$_2$) and hydrogen chloride, and as a raw material gas of an amorphous silicon, disilane and hydrogen chloride were employed respectively. The purity of each raw material was 6N The contents of hydrogen atom in a silicon oxide film and an amorphous silicon film thus obtained were confirmed to be both $1 \times 10^{19}$ atoms/cm$^3$ or less. Also, since the film forming was effected continuously without being exposed to the air, the concentration of carbon, nitrogen, and oxygen in the silicon film was confirmed to be $1 \times 10$ atoms/cm$^3$ or less.

Next, an amorphous silicon film was patterned into an island shape, and the very thin surface portion of the amorphous silicon was oxidized, in 2 to 10 nm thick by an anodic oxidation. The anodic oxidation was effected, using a platinum electrode as a cathode in an electrolyte containing N-methylacetoamide (NMA) or tetrahydrofurfurylalcohol (THF) added with KNO$_2$, by a constant voltage method at 10 to 50° C. After completion of the anodic oxidation, it was annealed at 600° C. in an argon atmosphere. Then, a silicon oxide film was formed thereon in 100 nm thick using a sputtering method. Here, as the sputtering atmosphere, a mixed gas of oxygen and argon or other rare gas and hydrogen chloride, in which the oxygen partial pressure was 80% or more and the hydrogen chloride concentration was 10%, was employed.

In the film forming by sputtering, a defect generated in a surface film by a shock of sputtering. For example, if the surface film is a silicon film, oxygen atom is implanted in silicon to increase oxygen concentration therein. Under such situation, silicon will be in a lot of the localized level. That is, a boundary between silicon and silicon oxide will be unclear. However, according to the present Example, by beforehand forming of the thin anodic oxidized film, the above mentioned atom mixing can be prevented, and the boundary between the silicon film and the silicon oxide film can be maintained, because the silicon oxide film (the thin anodic oxidized film) has been formed before the sputtering.

After forming of this silicon oxide film, an n$^+$-type microcrystal silicon film containing $10^{21}$ cm$^{-3}$ extent of phosphorus was formed, in 300 nm thick using a low pressure CVD method. The maximum process temperature in the above film forming was 650° C. Then, a gate electrode was patterned to form a gate electrode 410 and a gate insulating film 404. Further, a source and a drain regions 407 and 409 were formed, implanting $2 \times 10^{18}$ cm$^{-3}$ of arsenic ion by ion implantation method. Then, FIG. 4(A) was obtained.

Next, as shown in FIG. 4(B), PSG (phosphosilicate glass) film 413 was formed by a low pressure CVD method, and a side wall 414 shown in FIG. 4(C) was formed by a direction dependent etching. Further, $5 \times 10^{20}$ cm$^3$ of arsenic ion was implanted in the regions 407a and 409a by ion implantation method.

After that, a silicon nitride film 405 was formed throughout the surface, by a low pressure CVD method. Thereby, FIG. 4(D) was obtained. Then, it was annealed to activate the regions 407a, 407b, 408, 409a, and 409b, at 620° C. for 48 hrs. in a vacuum. As an interlayer insulation, PSG (phosphosilicate glass) film was formed all over the surface by a low pressure CVD method, and a hole for an electrode was made to form an aluminum electrodes in a source region and a drain region. Lastly, for the purpose of a passivation, a silicon nitride film was formed again throughout the surface, by a low pressure CVD method.

TFT prepared in this way, was remarkably high in a confidence. It pointed out that the features of device operation did not change by a so-called bias-temperature treatment (BT treatment). BT treatment is meant by the treatment that a voltage is applied between a source and a drain and to a gate electrode in heating. There is no problem in case of a normal device, but the features change is seen in case of a device in which for example, a mobile ion is contained. Such situation is shown in FIG. 6.

FIG. 6(A) indicates TFT in which a mobile ion exists in a gate insulating film and in a channel region. In the channel region, there exists an alkaline mobile ion (indicated as A$^+$ in FIG.) which functions as a donor. Then, the channel shows a weak N type (N$^-$-type), the state of which is referred to as state 1. By applying positive bias voltage to the gate electrode and between the source and drain of this TFT, as shown in FIG. 6(B), the mobile ion (positive ion) in the channel region will be made far away from a gate electrode in the first place, and then, the channel region will be made intrinsic (I-type). This state is referred to as state 2. Consequently, I$_D$ (drain current)–V$_G$ (gate voltage) characteristic of TFT will be moved largely to the rightside, as shown in FIG. 6(D).

However, in case where a mobile ion exists in a gate insulating film, the mobile ion gathers to the under part of a gate electrode (to the side of a channel region), owing to a bias voltage applied to a gate electrode. As a result, the channel region will have a positive electric field, and electron will gather therein. Then, the channel region shows a weak N type again. This state is referred to as state 3. As shown in FIG. 6(E), I$_D$–V$_G$ curve shifts to the left side from the state 2 to the state 3. After all, the curve has been shifted to the right side, compared with the first one. Also, in case where a negative bias is applied conversely, a mobile ion gathers in a channel region. Then, the channel region will proceed to N type, resulting in the state that the drain current can not be controlled by the gate voltage.

Concretely in the present Example, the gate voltage—drain current characteristic of TFT at room temperature was measured ($V_B$=0), immediately after TFT was prepared. Then, +20 V of voltage was applied to a gate electrode at 150° C. for an hour, and the gate voltage—drain current characteristic of TFT was measured at room temperature ($V_B$=+20 V). After that, −20 V of voltage was applied again to a gate electrode at 150° C. for an hour. Then, the gate voltage–drain current characteristic of TFT was measured at room temperature ($V_B$=−20 V), and the threshold value voltage fluctuation of TFT was examined.

The characteristic of TFT prepared by the method as described in the above is illustrated in FIG. 7(B). The bias voltage has no influence on TFT at all as such, and the fluctuation of threshold value voltage was 0.2 V or less as a result by an accurate measurement.

On the other hand, TFT shown in FIG. 7(A) is the one in case where the silicon nitride films 402 and 405 are not provided, and the halogen concentration of each film thereof is $1\times10^{14}$ cm$^{-3}$ or less, and also it is prepared by the same process with the method disclosed in the present Example, excepting the said points. As evident in the FIG. 7(A), the characteristic is dependent upon $V_B$ to a large extent. It is estimated that the content of a mobile ion in a gate electrode of TFT prepared by the present Example is in a degree of $8\times10^{10}$ cm$^{-3}$, from a fluctuation width point view of the threshold value voltage of FIG. 7(B).

After the above measurement, the concentrations of sodium, potassium, and lithium in a silicon film (channel region) and a gate insulating film of TFT prepared by the present Example were measured to be $3\times10^{17}$ cm$^{-3}$, $7\times10^{15}$ cm$^{-3}$, and $5\times10^{15}$ cm$^{-3}$ respectively. Though such a lot of alkaline element existed therein, the mobile ion amount was little. This fact is presumed to be caused by that it was fixed with halogen (with chlorine in this case). The measurement of sodium, potassium, and lithium concentration in TFT prepared for a comparison showed such much amount as $7\times10^{18}$ cm$^{-3}$, $2\times10^{16}$ cm$^{-3}$, and $4\times10^{19}$ cm$^{-3}$ respectively.

Thus, it can be presumed that the blocking effect of a silicon nitride film in accordance with the present invention is obtained as stated above. Namely, it is understood that the features and the confidence of TFT can be improved remarkably.

By the present invention, it is possible to prepare a thin film semiconductor device such as TFT, on which the influence of such a mobile ion as sodium can be reduced. And it is achieved that TFT can be prepared, even on a substrate, the device on which has not been able to be prepared so far, on account of the existence of a mobile ion therein. The present invention can be applied to a coplanar type as shown in FIGS. 1 to 4, an inverse coplanar type, a stagger type, and an inverse stagger type. Also, since the present invention does not impose restrictions on an operation of a thin film semiconductor device, the silicon of a transistor may be an amorphous, a polycrystal, a microcrystal, a single crystal and an intermediate state thereof.

What is claimed is:

1. A semiconductor device comprising:
   a first impurity blocking film formed on a glass substrate;
   an insulating film comprising silicon oxide formed on said first impurity blocking film;
   a thin film transistor formed on said insulating film, said thin film transistor including at least source, drain and channel regions, a pair of lightly doped regions between the channel region and the source region and between the drain region and the channel region, a gate insulating film and a gate electrode, said source, drain and channel regions and said pair of lightly doped regions comprising polycrystalline or single crystalline material;
   a second impurity blocking film covering said thin film transistor,
   wherein said second impurity blocking film is in direct contact with said first impurity blocking film, and
   wherein each of the gate insulating film and the channel region contains a halogen element.

2. A semiconductor device comprising:
   a first insulating film comprising silicon nitride on a substrate;
   a second insulating film comprising silicon oxide on said first insulating film;
   a semiconductor layer having at least source, drain and channel regions of a transistor formed on said second insulating film, said semiconductor layer comprising polycrystalline or single crystalline material;
   a third insulating film comprising silicon oxide formed on said semiconductor layer wherein said semiconductor layer is interposed between said second and third insulating films; and
   a fourth insulating film comprising silicon nitride formed over said third insulating film;
   wherein at least one of said first and fourth insulating films comprising silicon nitride has a thickness within a range from 50 to 1000 nm, and each of the third insulating film and the semiconductor layer contains a halogen element.

3. The semiconductor device according to claim 2 further comprising a gate electrode over said semiconductor layer.

4. The semiconductor device according to claim 2 wherein said semiconductor layer is substantially enclosed by said second and third insulating films.

5. The semiconductor device according to claim 2 wherein said substrate is a glass substrate.

6. The semiconductor device according to claim 2 wherein said semiconductor layer comprises a material selected from the group consisting of silicon, germanium and an alloy thereof.

7. The semiconductor device according to claim 2 wherein said semiconductor layer comprises poly or single crystal silicon.

8. A semiconductor device having at least one thin film transistor, comprising:
   a first insulating film comprising silicon nitride provided over a substrate;
   a second insulating film comprising silicon oxide on said first insulating film;
   a source or drain region of the thin film transistor formed on said second insulating film, said source or drain region comprising polycrystalline or single crystalline material;
   a third insulating film comprising silicon oxide formed on said source or drain region wherein said source or drain region is interposed between said second and third insulating films; and
   a fourth insulating film comprising silicon nitride formed over said third insulating film;
   wherein at least one of said first and fourth insulating films comprising silicon nitride has a thickness within a range from 50 to 1000 nm, and
   wherein each of said second insulating film and said third insulating film contains a halogen element.

9. The semiconductor device according to claim 8 wherein said thin film transistor has a top-gate structure.

10. The semiconductor device according to claim 8 wherein each of the second and third insulating films extends beyond a side edge of the source or drain region.

11. The semiconductor device according to claim 8 wherein said substrate is a glass substrate.

12. The semiconductor device according to claim 8 wherein said source or drain comprises a material selected from the group consisting of silicon, germanium and an alloy thereof.

13. The semiconductor device according to claim 8 wherein said source or drain region comprises poly or single crystal silicon.

14. A semiconductor device comprising:
   a substrate;
   a thin film transistor formed over a first region of said substrate, said thin film transistor having a semiconductor layer for forming at least source, drain and channel regions, said semiconductor layer comprising polycrystalline or single crystalline material;
   a laminated structure formed on a second region of said substrate adjacent to said first region, said laminated structure comprising a first insulating film comprising silicon nitride formed on said substrate, a second insulating film comprising silicon oxide formed on said first insulating film, a third insulating film comprising silicon oxide formed on said second insulating film, and a fourth insulating film comprising silicon nitride formed over said third insulating film,
   wherein said first and second insulating films extend below the semiconductor layer of said thin film transistor while said third and fourth insulating films extend over the semiconductor layer;
   wherein at least one of said first and fourth insulating films comprising silicon nitride has a thickness within a range from 50 to 1000 nm, and
   wherein each of the semiconductor layer and the third insulating film contains a halogen element.

15. The semiconductor device according to claim 14 wherein said thin film transistor has a top-gate structure.

16. The semiconductor device according to claim 14 wherein said second and third insulating films directly contact each other.

17. The semiconductor device according to claim 14 wherein said substrate is a glass substrate.

18. The semiconductor device according to claim 14 wherein said semiconductor layer comprises a material selected from the group consisting of silicon, germanium and an alloy thereof.

19. The semiconductor device according to claim 14 wherein said semiconductor layer comprises poly or single crystal silicon.

20. A semiconductor device comprising:
   a substrate;
   a thin film transistor formed over a first region of said substrate, said thin film transistor having a semiconductor layer for forming at least source, drain and channel regions and a gate electrode located over the channel region, said semiconductor layer comprising polycrystalline or single crystalline material;
   a laminated structure formed on a second region of said substrate adjacent to said first region, said laminated structure comprising a first insulating film comprising silicon nitride formed on said substrate, a second insulating film comprising silicon oxide formed on said first insulating film, a third insulating film comprising silicon oxide formed over said second insulating film, and a fourth insulating film comprising silicon nitride formed on said third insulating film,
   wherein said first and second insulating films extend below the semiconductor layer of said thin film transistor while said third and fourth insulating films extend over the gate electrode;
   wherein at least one of said first and fourth insulating films comprising silicon nitride has a thickness within a range from 50 to 1000 nm, and
   wherein each of the semiconductor layer and the third insulating film contains a halogen element.

21. The semiconductor device according to claim 20 wherein said second and third insulating films directly contact each other.

22. The semiconductor device according to claim 20 wherein said substrate is a glass substrate.

23. The semiconductor device according to claim 20 wherein said semiconductor layer comprises a material selected from the group consisting of silicon, germanium and an alloy thereof.

24. The semiconductor device according to claim 20 wherein said semiconductor layer comprises poly or single crystal silicon.

25. A semiconductor device comprising:
   a substrate;
   a thin film transistor formed over a first region of said substrate, said thin film transistor having a semiconductor layer for forming at least source, drain and channel regions, said semiconductor layer comprising polycrystalline or single crystalline material;
   a laminated structure formed on a second region of said substrate adjacent to said first region, said laminated structure comprising a first insulating film comprising silicon nitride formed on said substrate, a second insulating film comprising silicon oxide formed on said first insulating film, a third insulating film comprising silicon oxide formed on said second insulating film, and a fourth insulating film comprising silicon nitride formed over said third insulating film;
   an electrode formed over said fourth insulating film and electrically connected to one of the source and drain regions of the thin film transistor through a hole opened through the third and fourth insulating films,
   wherein said first and second insulating films extend below the semiconductor layer of said thin film transistor while said third and fourth insulating films extend over the semiconductor layer,
   wherein at least one of said first and fourth insulating films comprising silicon nitride has a thickness within a range from 50 to 1000 nm, and
   wherein each of the semiconductor layer and the third insulating film contains a halogen element.

26. The semiconductor device according to claim 25 wherein said second and third insulating films directly contact each other.

27. The semiconductor device according to claim 25 wherein said substrate is a glass substrate.

28. The semiconductor device according to claim 25 wherein said semiconductor layer comprises a material selected from the group consisting of silicon, germanium and an alloy thereof.

29. The semiconductor device according to claim 25 wherein said semiconductor layer comprises poly or single crystal silicon.

30. A semiconductor device comprising:

a substrate;

a thin film transistor formed over a first region of said substrate, said thin film transistor having a semiconductor layer for forming at least source, drain and channel regions, said semiconductor layer comprising polycrystalline or single crystalline material;

a laminated structure formed on a second region of said substrate adjacent to said first region, said laminated structure comprising a first insulating film comprising silicon nitride formed on said substrate, a second insulating film comprising silicon oxide formed on said first insulating film, a third insulating film comprising silicon oxide formed on said second insulating film, a fourth insulating film comprising silicon nitride formed on said third insulating film, and a fifth insulating film comprising silicon oxide formed on said fourth insulating film;

an electrode formed on said fifth insulating film and electrically connected to one of the source and drain regions of the thin film transistor through a hole opened through the third, fourth and fifth insulating films, wherein said first and second insulating films extend below the semiconductor layer of said thin film transistor while said third, fourth and fifth insulating films extend over the semiconductor layer.

31. The semiconductor device according to claim 30 wherein said second and third insulating films directly contact each other.

32. The semiconductor device according to claim 30 wherein said substrate is a glass substrate.

33. The semiconductor device according to claim 30 wherein said semiconductor layer comprises a material selected from the group consisting of silicon, germanium and an alloy thereof.

34. The semiconductor device according to claim 30 wherein said semiconductor layer comprises poly or single crystal silicon.

35. The semiconductor device according to claim 30 wherein at least one of said first and fourth insulating films comprising silicon nitride has a thickness within a range from 50 to 1000 nm.

36. A semiconductor device having at least one thin film transistor, comprising:

a substrate;

a first insulating film comprising silicon nitride;

a second insulating film comprising silicon oxide;

a semiconductor layer formed on said second insulating film wherein said semiconductor layer includes source and drain regions, a channel region between the source and drain regions, at least one lightly doped region between said channel region and one of said source and drain regions, said semiconductor layer comprising polycrystalline or single crystalline material;

a gate electrode adjacent to said semiconductor layer; and an ion blocking insulating film comprising silicon nitride over said gate electrode, wherein each of the second insulating film and the semiconductor layer contains a halogen element.

37. The semiconductor device according to claim 36 wherein said lightly doped region extends beyond a side edge of said gate electrode.

38. The semiconductor device according to claim 36 wherein said gate electrode is located over said semiconductor layer.

39. The semiconductor device according to claim 36 wherein said substrate is a glass substrate.

40. The semiconductor device according to claim 36 wherein said semiconductor layer comprises a material selected from the group consisting of silicon, germanium and an alloy thereof.

41. The semiconductor device according to claim 36 wherein said semiconductor layer comprises poly or single crystal silicon.

42. The semiconductor device according to claim 36 wherein at least one of said first insulating film and said ion blocking insulating film comprising silicon nitride has a thickness within a range from 50 to 1000 nm.

43. A semiconductor device comprising:

a substrate;

a first insulating film comprising silicon nitride;

a second insulating film comprising silicon oxide;

a semiconductor layer formed on said second insulating film wherein said semiconductor layer includes a pair of source and drain regions, a channel region between the source and drain regions, at least one lightly doped region between said channel region and one of said source and drain regions, said semiconductor layer comprising polycrystalline or single crystalline material;

a gate electrode located adjacent said semiconductor layer; and a third insulating film comprising 'silicon nitride formed over said semiconductor layer, wherein each of the second insulating film and the semiconductor layer contains a halogen element.

44. The semiconductor device according to claim 43 wherein said gate electrode is located over said semiconductor layer.

45. The semiconductor device according to claim 43 wherein said lightly doped region extends beyond a side edge of said gate electrode.

46. The semiconductor device according to claim 43 wherein said substrate is a glass substrate.

47. The semiconductor device according to claim 43 wherein said semiconductor layer comprises a material selected from the group consisting of silicon, germanium and an alloy thereof.

48. The semiconductor device according to claim 43 wherein said semiconductor layer comprises poly or single crystal silicon.

49. The semiconductor device according to claim 43 wherein at least one of said first and third insulating films comprising silicon nitride has a thickness within a range from 50 to 1000 nm.

50. A semiconductor device having at least one thin film transistor formed over a substrate, comprising:

a semiconductor layer formed over said substrate wherein said semiconductor layer includes source and drain regions, a channel region between the source and drain regions, at least one lightly doped region between said channel region and one of said source and drain regions, said semiconductor layer comprising polycrystalline or single crystalline material;

a gate electrode formed over said semiconductor layer with a gate insulating film interposed therebetween;

a laminate structure comprising a first insulating film and a second insulating film wherein said semiconductor layer is located on said laminate structure; and side wall insulators formed on side surfaces of the gate electrode;

an ion blocking insulating film comprising silicon nitride over said semiconductor layer, said gate electrode and said side wall insulators wherein said ion blocking insulating film is in direct contact with an upper surface of the gate electrode and said side wall insulators, wherein said first insulating film comprises silicon oxide and said second insulating film comprises silicon nitride, and said first insulating film is in direct contact with said semiconductor layer.

51. The semiconductor device according to claim 50 wherein said gate electrode is located over said semiconductor layer.

52. The semiconductor device according to claim 50 wherein said lightly doped region extends beyond a side edge of said gate electrode.

53. The semiconductor device according to claim 50 wherein said substrate is a glass substrate.

54. The semiconductor device according to claim 50 wherein said semiconductor layer comprises a material selected from the group consisting of silicon, germanium and an alloy thereof.

55. The semiconductor device according to claim 50 wherein said semiconductor layer comprises poly or single crystal silicon.

56. The semiconductor device according to claim 50 wherein at least one of said second insulating film and said ion blocking insulating film comprising silicon nitride has a thickness within a range from 50 to 1000 nm.

57. A semiconductor device comprising:
a substrate;
a first insulating film comprising silicon nitride formed over the substrate;
a second insulating film comprising silicon oxide formed on the first insulating film;
a semiconductor layer comprising crystalline silicon formed on the second insulating film, said semiconductor layer including at least source and drain regions and a channel region therebetween;
a third insulating film comprising silicon oxide formed on the semiconductor layer, said third insulating film extending beyond side edges of the semiconductor layer to cover an exposed upper surface of the second insulating film;
a gate electrode formed over the channel region of the semiconductor layer with the third insulating film interposed therebetween; and
a fourth insulating film comprising silicon nitride formed on the gate electrode, said fourth insulating film extending beyond side edges of the gate electrode to cover an exposed upper surface of the third insulating film,
wherein side surfaces of the gate electrode are covered by and are in direct contact with said fourth insulating film.

58. A semiconductor device comprising:
a substrate;
a first insulating film comprising silicon nitride formed over the substrate;
a second insulating film comprising silicon oxide formed on the first insulating film;
a semiconductor layer comprising crystalline silicon formed on the second insulating film, said semiconductor layer including at least source and drain regions and a channel region therebetween;
a third insulating film comprising silicon oxide formed on the semiconductor layer, said third insulating film extending beyond side edges of the semiconductor layer to cover an exposed upper surface of the second insulating film;
a gate electrode formed over the channel region of the semiconductor layer with the third insulating film interposed therebetween;
a fourth insulating film comprising silicon nitride formed on the gate electrode, said fourth insulating film extending beyond side edges of the gate electrode to cover an exposed upper surface of the third insulating film, wherein side surfaces of the gate electrode are covered by and are in direct contact with said fourth insulating film;
a fifth insulating film formed on the fourth insulating film;
a source electrode formed over the fifth insulating film and electrically connected to the source region through a first contact hole opened through the third, fourth and fifth insulating films; and
a drain electrode formed over the fifth insulating film and electrically connected to the drain region through a second contact hole opened through the third, fourth and fifth insulating films.

59. The semiconductor device according to claim 58 wherein said fifth insulating film comprises silicon oxide.

60. The semiconductor device according to claim 58 wherein said fifth insulating film comprises phosphosilicate glass.

61. A semiconductor device comprising:
a substrate;
a first insulating film comprising silicon nitride formed over the substrate;
a second insulating film comprising silicon oxide formed on the first insulating film wherein said first insulating film extends beyond side edges of the second insulating film;
a semiconductor layer comprising crystalline silicon formed on the second insulating film, said semiconductor layer including at least source and drain regions and a channel region therebetween;
a third insulating film comprising silicon oxide formed on the semiconductor layer, wherein upper surfaces of the source and drain regions are exposed from said third insulating film;
a gate electrode formed over the channel region of the semiconductor layer with the third insulating film interposed therebetween; and
a fourth insulating film comprising silicon nitride formed on the gate electrode, said fourth insulating film extending beyond side edges of the gate electrode to cover the exposed upper surfaces of the source and drain regions, wherein side surfaces of the gate electrode are covered by and are in direct contact with said fourth insulating film, and
wherein said fourth insulating film extends beyond side edges of the semiconductor layer to cover exposed surfaces of the first insulating film and is in direct contact with said exposed surfaces of the first insulating film.

62. A semiconductor device comprising:
a substrate;
a first insulating film comprising silicon nitride formed over the substrate;
a second insulating film comprising silicon oxide formed on the first insulating film wherein said first insulating film extends beyond side edges of the second insulating film;

a semiconductor layer comprising crystalline silicon formed on the second insulating film, said semiconductor layer including at least source and drain regions and a channel region therebetween;

a third insulating film comprising silicon oxide formed on the semiconductor layer, wherein upper surfaces of the source and drain regions are exposed from said third insulating film;

a gate electrode formed over the channel region of the semiconductor layer with the third insulating film interposed therebetween;

a fourth insulating film comprising silicon nitride formed on the gate electrode, said fourth insulating film extending beyond side edges of the gate electrode to cover the exposed upper surfaces of the source and drain regions, wherein side surfaces of the gate electrode are covered by and are in direct contact with said fourth insulating film, and wherein said fourth insulating film extends beyond side edges of the semiconductor layer to cover exposed surfaces of the first insulating film and is in direct contact with said exposed surfaces of the first insulating film;

a fifth insulating film formed on the fourth insulating film;

a source electrode formed over the fifth insulating film and electrically connected to the source region through a first contact hole opened through said fourth and fifth insulating films; and a drain electrode formed over the fifth insulating film and electrically connected to the drain region through a second contact hole opened through said fourth and fifth insulating films.

63. A semiconductor device comprising:

a substrate;

a first insulating film comprising silicon nitride formed over the substrate;

a second insulating film comprising silicon oxide formed on the first insulating film wherein said first insulating film extends beyond side edges of the second insulating film;

a semiconductor layer comprising crystalline silicon formed on the second insulating film, said semiconductor layer including at least source and drain regions and a channel region therebetween;

a third insulating film comprising silicon oxide formed on the semiconductor layer and covering said source, drain and channel regions;

a gate electrode formed over the channel region of the semiconductor layer with the third insulating film interposed therebetween; and a fourth insulating film comprising silicon nitride formed on the gate electrode, said fourth insulating film extending beyond side edges of the gate electrode to cover exposed upper surfaces of the third insulating film, wherein side surfaces of the gate electrode are covered by and are in direct contact with said fourth insulating film, and wherein said fourth insulating film extends beyond side edges of the semiconductor layer to cover exposed surfaces of the first insulating film and is in direct contact with said exposed surfaces of the first insulating film.

64. A semiconductor device comprising:

a substrate;

a first insulating film comprising silicon nitride formed over the substrate;

a second insulating film comprising silicon oxide formed on the first insulating film wherein said first insulating film extends beyond side edges of the second insulating film;

a semiconductor layer comprising crystalline silicon formed on the second insulating film, said semiconductor layer including at least source and drain regions and a channel region therebetween;

a third insulating film comprising silicon oxide formed on the semiconductor layer and covering said source, drain and channel regions;

a gate electrode formed over the channel region of the semiconductor layer with the third insulating film interposed therebetween;

a fourth insulating film comprising silicon nitride formed on the gate electrode, said fourth insulating film extending beyond side edges of the gate electrode to cover exposed upper surfaces of the third insulating film, wherein side surfaces of the gate electrode are covered by and are in direct contact with said fourth insulating film, and wherein said fourth insulating film extends beyond side edges of the semiconductor layer to cover exposed surfaces of the first insulating film and is in direct contact with said exposed surfaces of the first insulating film;

a fifth insulating film formed on the fourth insulating film;

a source electrode formed over the fifth insulating film and electrically connected to the source region through a first contact hole opened through said third, fourth and fifth insulating films; and a drain electrode formed over the fifth insulating film and electrically connected to the drain region through a second contact hole opened through said third, fourth and fifth insulating films.

65. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor comprising crystalline silicon formed on the second insulating film, said semiconductor layer including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein each of the semiconductor layer and the third insulating film contains a halogen element and each of the first and fourth insulating films extends beyond side edges of the semiconductor layer.

66. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said gate electrode overlaps said pair of lightly doped regions at least partly, and wherein each of the third insulating film and the semiconductor layer contains a halogen element.

67. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said pair of lightly doped regions extend beyond side edges of the gate electrode, and wherein each of the third insulating film and the semiconductor layer contains a halogen element.

68. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a gate electrode formed over the channel region of the semiconductor layer; and a third insulating film comprising silicon nitride covering said thin film transistor wherein an insulating material comprising silicon oxide is disposed between said lightly doped regions and said third insulating film, wherein each of the second insulating film and the semiconductor layer contains a halogen element.

69. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a gate electrode formed over the channel region of the semiconductor layer; and a third insulating film comprising silicon nitride covering said thin film transistor wherein an insulating material comprising silicon oxide is disposed between said lightly doped regions and said third insulating film, and wherein said gate electrode overlaps said pair of lightly doped regions at least partly, and wherein each of the second insulating film and the semiconductor layer contains a halogen element.

70. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a gate electrode formed over the channel region of the semiconductor layer; and a third insulating film comprising silicon nitride covering said thin film transistor wherein an insulating material comprising silicon oxide is disposed between said lightly doped regions and said third insulating film, and wherein said lightly doped regions extend beyond side edges of the gate electrode, and wherein each of the second insulating film and the semiconductor layer contains a halogen element.

71. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor comprising crystalline silicon formed on the second insulating film, said semiconductor layer including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor wherein an upper surface of said gate electrode is in direct contact with said fourth insulating film.

72. A semiconductor device including at least one thin film transistor, comprising:

a substrate;

a first insulating film comprising silicon nitride formed over the substrate;

a second insulating film comprising silicon oxide formed on the first insulating film;

semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said gate electrode overlaps said pair of lightly doped regions at least partly and an upper surface of said gate electrode is in direct contact with said fourth insulating film.

73. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said pair of lightly doped regions extend beyond side edges of the gate electrode and an upper surface of said gate electrode is in direct contact with said fourth insulating film.

74. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a gate electrode formed over the channel region of the semiconductor layer; and a third insulating film comprising silicon nitride covering said thin film transistor wherein an insulating material comprising silicon oxide is disposed between said lightly doped regions and said third insulating film and an upper surface of said gate electrode is in direct contact with said third insulating film.

75. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a gate electrode formed over the channel region of the semiconductor layer; and a third insulating film comprising silicon nitride covering said thin film transistor wherein an insulating material comprising silicon oxide is disposed between said lightly doped regions and said third insulating film, and wherein said gate electrode overlaps said pair of lightly doped regions at least partly and an upper surface of said gate electrode is in direct contact with said third insulating film.

76. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a gate electrode formed over the channel region of the semiconductor layer; and a third insulating film comprising silicon nitride covering said thin film transistor wherein an insulating material comprising silicon oxide is disposed between said lightly doped regions and said third insulating film, and wherein said lightly doped regions extend beyond side edges of the gate electrode and an upper surface of said gate electrode is in direct contact with said third insulating film.

77. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor comprising crystalline silicon formed on the second insulating film, said semiconductor layer including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween;

side wall insulators formed on side surfaces of the gate electrode; and a fourth insulating film comprising silicon nitride covering said thin film transistor, wherein said fourth insulating film is in direct contact with the side wall insulators.

78. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor comprising crystalline silicon formed on the second insulating film, said semiconductor layer including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said fourth insulating film extends beyond side edges of the semiconductor layer, and wherein each of the semiconductor layer and the third insulating film contains a halogen element.

79. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said gate electrode overlaps said pair of lightly doped regions at least partly, wherein said fourth insulating film extends beyond side edges of the semiconductor layer, and wherein each of the semiconductor layer and the third insulating film contains a halogen element.

80. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said pair of lightly doped regions extend beyond side edges of the gate electrode, wherein said fourth insulating film extends beyond side edges of the semiconductor layer, and wherein each of the semiconductor layer and the third insulating film contains a halogen element.

81. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said gate electrode overlaps said pair of lightly doped regions at least partly, and wherein said pair of lightly doped regions are in contact with both said second insulating film and said third insulating film.

82. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor formed on the second insulating film, said semiconductor layer comprising crystalline silicon and including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween; and a fourth insulating film comprising silicon nitride covering said thin film transistor, wherein said pair of lightly doped regions extend beyond side edges of the gate electrode, and wherein said pair of lightly doped regions are in contact with both said second insulating film and said third insulating film.

83. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor comprising crystalline silicon formed on the second insulating film, said semiconductor layer including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween;

side wall insulators formed on side surfaces of the gate electrode; and a fourth insulating film comprising silicon nitride covering said thin film transistor, wherein said pair of lightly doped regions are in contact with both said second insulating film and said third insulating film.

84. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor comprising crystalline silicon formed on the second insulating film, said semiconductor layer including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween;

side wall insulators formed on side surfaces of the gate electrode; and a fourth insulating film comprising silicon nitride covering said thin film transistor, wherein said gate electrode overlaps said pair of lightly doped regions at least partly, and wherein said pair of lightly doped regions are in contact with both said second insulating film and said third insulating film.

85. A semiconductor device including at least one thin film transistor, comprising:

a substrate;

a first insulating film comprising silicon nitride formed over the substrate;

a second insulating film comprising silicon oxide formed on the first insulating film;

a semiconductor layer of said thin film transistor comprising crystalline silicon formed on the second insulating film, said semiconductor layer including at least source and drain regions and a channel region therebetween, and a pair of lightly doped regions formed between said channel region and said source and drain regions, said pair of lightly doped regions having a lower impurity concentration than said source and drain regions;

a third insulating film comprising silicon oxide formed on the semiconductor layer;

a gate electrode formed over the channel region of the semiconductor layer with the third insulating film interposed therebetween;

side wall insulators formed on side surfaces of the gate electrode; and a fourth insulating film comprising silicon nitride covering said thin film transistor, wherein said pair of lightly doped regions extend beyond side edges of the gate electrode, and wherein said pair of lightly doped regions are in contact with both said second insulating film and said third insulating film.

86. The semiconductor device according to any one of claims 1, 2, 8, 19, 20, 25, 36, 43, 65, 66, 67, 68, 69, 70, 78, 79 and 80 wherein the halogen element is selected from the group consisting of fluorine and chlorine.

87. The semiconductor device according to any one of claims 1, 2, 14, 20, 25, 65, 66, 67, 78, 79 and 80 wherein the halogen element is contained at a concentration not higher than $5 \times 10^{20}$ atoms/cm$^3$.

88. The semiconductor device according to any one of claims 57–80 wherein said substrate is a glass substrate.

89. The semiconductor device according to any one of claims 57–80 wherein said semiconductor layer comprises polycrystal silicon.

90. The semiconductor device according to any one of claims 81 and 82 wherein said semiconductor layer comprises polysilicon.

91. The semiconductor device according to any one of claims 81 and 82 wherein each of the semiconductor layer and the third insulating film contains a halogen element.

92. The semiconductor device according to any one of claims 83, 84 and 85 wherein said fourth insulating film is in direct contact with said side wall insulators.

93. The semiconductor device according to any one of claims 83, 84, and 85 wherein said semiconductor layer comprises polysilicon.

94. The semiconductor device according to any one of claims 83, 84 and 85 wherein each of the semiconductor layer and the third insulating film contains a halogen element.

95. A semiconductor device comprising:

a substrate;

a first insulating film comprising silicon nitride formed over the substrate;

a second insulating film comprising silicon oxide formed on the first insulating film;

a semiconductor layer comprising crystalline silicon formed on the second insulating film, said semiconductor layer including at least source and drain regions and a channel region therebetween;

a third insulating film comprising silicon oxide formed on the semiconductor layer, said third insulating film extending beyond side edges of the semiconductor layer to cover an exposed upper surface of the second insulating film;

a gate electrode formed over the channel region of the semiconductor layer with the third insulating film interposed therebetween;

a fourth insulating film comprising silicon nitride formed over the gate electrode, said fourth insulating film extending beyond side edges of the gate electrode to cover an exposed upper surface of the third insulating film;

a fifth insulating film formed on the fourth insulating film;

an electrode formed over the fifth insulating film and electrically connected to one of the source region and the drain region through a contact hole opened through the third, fourth and fifth insulating films.

96. The semiconductor device according to claim 95 wherein said fifth insulating film comprises silicon oxide.

97. The semiconductor device according to claim 95 wherein said fifth insulating film comprises phosphosilicate glass.

98. The semiconductor device according to claim 95 wherein said substrate is a glass substrate.

99. The semiconductor device according to claim 95 wherein said semiconductor layer comprises polysilicon.

100. A semiconductor device comprising:

a substrate;

a first insulating film comprising silicon nitride formed over the substrate;

a second insulating film comprising silicon oxide formed on the first insulating film;

a semiconductor layer comprising crystalline silicon formed on the second insulating film, said semiconductor layer including at least source and drain regions and a channel region therebetween;

a third insulating film comprising silicon oxide formed on the semiconductor layer, said third insulating film extending beyond side edges of the semiconductor layer to cover an exposed upper surface of the second insulating film;

a gate electrode formed over the channel region of the semiconductor layer with the third insulating film interposed therebetween;

a fourth insulating film comprising silicon nitride formed on the gate electrode, said fourth insulating film extending beyond side edges of the gate electrode to cover an exposed upper surface of the third insulating film, wherein side surfaces of the gate electrode are covered by and are in direct contact with said fourth insulating film;

a fifth insulating film formed on the fourth insulating film;

an electrode formed over the fifth insulating film and electrically connected to one of the source region and the drain region through a contact hole opened through the third, fourth and fifth insulating films.

101. The semiconductor device according to claim 100 wherein said fifth insulating film comprises silicon oxide.

102. The semiconductor device according to claim 100 wherein said fifth insulating film comprises phosphosilicate glass.

103. The semiconductor device according to claim 100 wherein said substrate is a glass substrate.

104. The semiconductor device according to claim 100 wherein said semiconductor layer comprises polysilicon.

* * * * *

UNITED STATES PATENT AND TRADEMARK OFFICE
CERTIFICATE OF CORRECTION

PATENT NO. : 6,849,872 B1
APPLICATION NO. : 08/202680
DATED : February 1, 2005
INVENTOR(S) : Shunpei Yamazaki et al.

It is certified that error appears in the above-identified patent and that said Letters Patent is hereby corrected as shown below:

On the title page item [56],
"OTHER PUBLICATIONS" line 9, replace "*Revocation*issued" with --*Revocation* issued--; and line 11, replace "*Opposition*cited" with --*Opposition* cited--.
    Column 5, line 26, replace "fleon" with --freon--.
    Column 9, lines 7 and 8, replace "cl EXAMPLE 2" with a line space and --EXAMPLE 2--.
Claim 43, line 15, after "comprising" delete the apostrophe symbol.

Signed and Sealed this

Twelfth Day of September, 2006

JON W. DUDAS
*Director of the United States Patent and Trademark Office*

UNITED STATES PATENT AND TRADEMARK OFFICE
CERTIFICATE OF CORRECTION

PATENT NO. : 6,849,872 B1 Page 1 of 1
APPLICATION NO. : 08/202680
DATED : February 1, 2005
INVENTOR(S) : Shunpei Yamazaki et al.

It is certified that error appears in the above-identified patent and that said Letters Patent is hereby corrected as shown below:

Column 9, line 37, replace "6N" be changed to --99.9999%.--.

Signed and Sealed this

Twentieth Day of February, 2007

JON W. DUDAS
*Director of the United States Patent and Trademark Office*